US011876113B2

United States Patent
Yen et al.

(10) Patent No.: US 11,876,113 B2
(45) Date of Patent: Jan. 16, 2024

(54) INTEGRATED TRANSFORMER

(71) Applicant: REALTEK SEMICONDUCTOR CORPORATION, Hsinchu (TW)

(72) Inventors: Hsiao-Tsung Yen, Hsinchu (TW); Ka-Un Chan, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 484 days.

(21) Appl. No.: 16/722,578

(22) Filed: Dec. 20, 2019

(65) Prior Publication Data
US 2020/0251550 A1   Aug. 6, 2020

Related U.S. Application Data

(60) Provisional application No. 62/799,045, filed on Jan. 31, 2019.

(51) Int. Cl.
*H01F 19/04* (2006.01)
*H01L 49/02* (2006.01)
*H01F 27/28* (2006.01)

(52) U.S. Cl.
CPC ......... *H01L 28/10* (2013.01); *H01F 27/2804* (2013.01); *H01F 2027/2809* (2013.01)

(58) Field of Classification Search
CPC ......... H01F 27/2804; H01F 2027/2809; H01F 17/0013; H01F 19/04; H01F 17/0006; H01L 28/10
See application file for complete search history.

(56) References Cited

U.S. PATENT DOCUMENTS

2015/0364243 A1   12/2015   Yen et al.
2017/0012601 A1   1/2017    Yen
2017/0098500 A1*  4/2017    Yen .......................... H01F 27/29

OTHER PUBLICATIONS

U.S. Appl. No. 16/293,876, filed Mar. 6, 2019.
U.S. Appl. No. 16/375,062, filed Mar. 6, 2019.

* cited by examiner

*Primary Examiner* — Tony Tran
(74) *Attorney, Agent, or Firm* — WPAT, P.C.

(57) ABSTRACT

An integrated transformer is provided. The integrated transformer includes a first inductor and second inductors. The first inductor includes a first winding having a first outer turn and a second winding having a second outer turn. The second inductor includes a third winding having a third outer turn and a fourth winding having a fourth outer turn. The first and third outer turns substantially overlap, and the second and fourth outer turns substantially overlap. The first and second outer turns are connected to each other through a first segment and a second segment that together form a crossing structure, and the third and fourth outer turns are connected to each other through a third segment and a fourth segment that together form a crossing structure. The first and third segments are in the first metal layer, while the second and fourth segments are in the second metal layer.

8 Claims, 11 Drawing Sheets

INTEGRATED TRANSFORMER

BACKGROUND OF THE INVENTION

1. Field of the Invention

The present invention generally relates to semiconductor elements, and, more particularly, to integrated transformers.

2. Description of Related Art

Transformers are important elements in radio frequency (RF) integrated circuits to implement single-ended to differential signal conversion, signal coupling and impedance matching. As System-on-chips (SoC) become the mainstream of integrated circuits, integrated transformers are gradually substituted for conventional discrete elements and are commonly applied to RF integrated circuits. However, transformers in integrated circuits often take up large areas; therefore, it becomes an important issue to reduce the areas of transformers in integrated circuits without degrading element performances, such as coupling coefficient (K).

In particular, an 8-shaped integrated transformer is hard to design due to its crossing structure in the central region and its symmetry.

SUMMARY OF THE INVENTION

In view of the issues of the prior art, an object of the present invention is to provide integrated transformers.

An integrated transformer is provided. The integrated transformer includes a first inductor and a second inductor. The first inductor is substantially implemented in a first metal layer of a semiconductor structure and includes a first winding and a second winding. The first winding has a first end point and a second end point, and the second winding has a third end point and a fourth end point. The first end point is connected to the third end point through a first segment, and the second end point is connected to the fourth end point through a second segment. The second inductor is substantially implemented in a second metal layer of the semiconductor structure and includes a third winding and a fourth winding. The third winding has a fifth end point and a sixth end point, and the fourth winding has a seventh end point and an eighth end point. The fifth end point is connected to the seventh end point through a third segment, and the sixth end point is connected to the eighth end point through a fourth segment. The first segment and the second segment form a first crossing structure, and the third segment and the fourth segment form a second crossing structure. The first segment and the third segment are implemented in the first metal layer, and the second segment and the fourth segment are implemented in the second metal layer. The first metal layer is different from the second metal layer.

An integrated transformer is also provided. The integrated transformer includes a first inductor and a second inductor. The first inductor is substantially implemented in a first metal layer of a semiconductor structure and includes a first winding and a second winding. The first winding has a first outer turn and a first inner turn, and the second winding has a second outer turn and a second inner turn. The second inductor is substantially implemented in a second metal layer of the semiconductor structure and includes a third winding and a fourth winding. The third winding has a third outer turn and a third inner turn, and the fourth winding has a fourth outer turn and a fourth inner turn. The first outer turn and the third outer turn substantially overlap, and the second outer turn and the fourth outer turn substantially overlap. The first outer turn and the second outer turn are connected through a first segment and a second segment crossing each other, and the third outer turn and the fourth outer turn are connected through a third segment and a fourth segment crossing each other. The first segment and the third segment are in the first metal layer, and the second segment and the fourth segment are in the second metal layer. The first metal layer is different from the second metal layer.

Compared with the conventional technology, the integrated transformers of the present invention has the following advantages: (1) the two inductors of the integrated transformers are highly symmetric; (2) excellent coupling efficiency; and (3) the integrated transformers are easy to implement as only two metal layers are required for the two crossing structures in the central region of the integrated transformers.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes integrated transformers. On account of that some or all elements of the integrated transformers could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 1A:
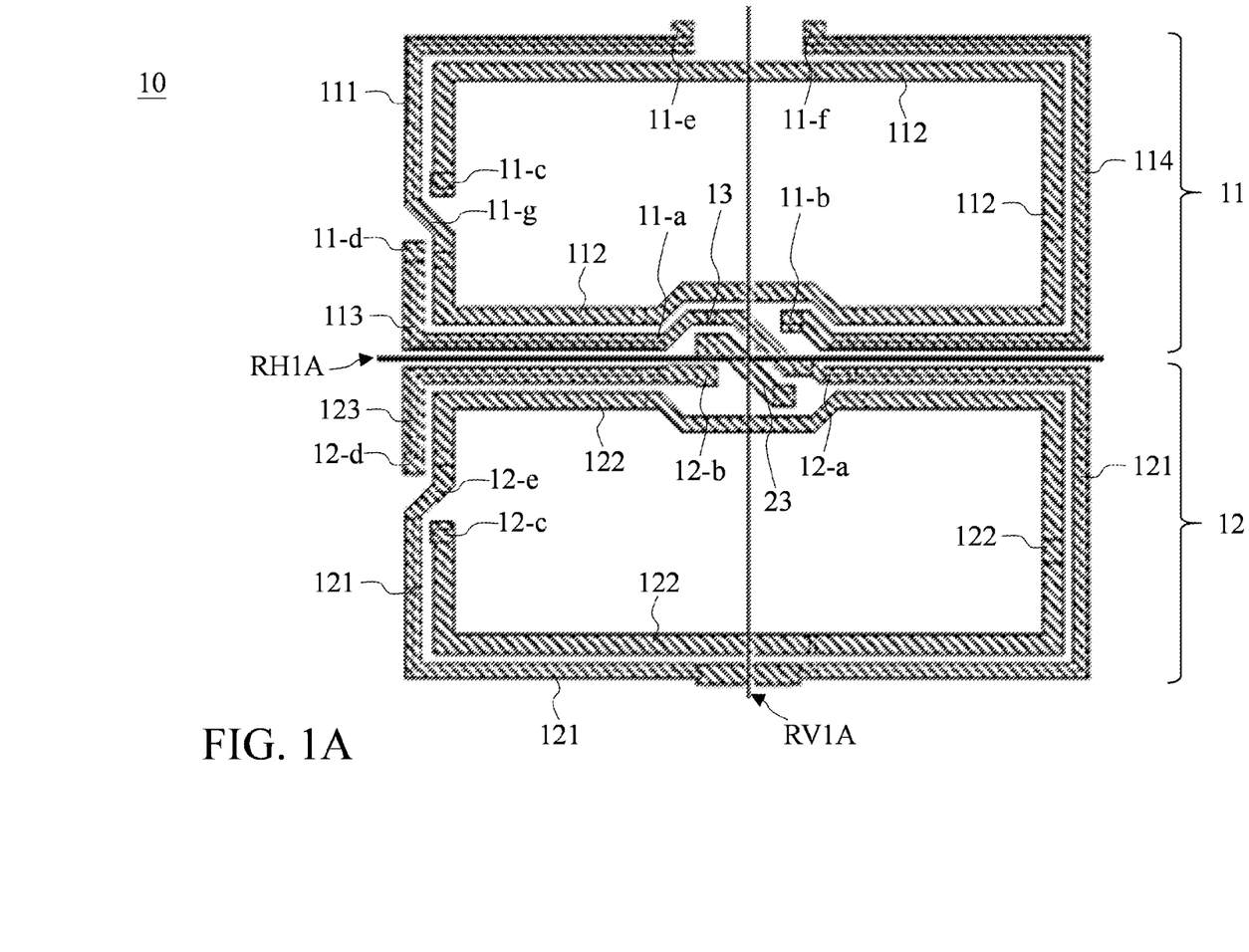
FIGS. 1A to 1C illustrate the structure of an integrated transformer according to an embodiment of the present invention.
Figure 1B:
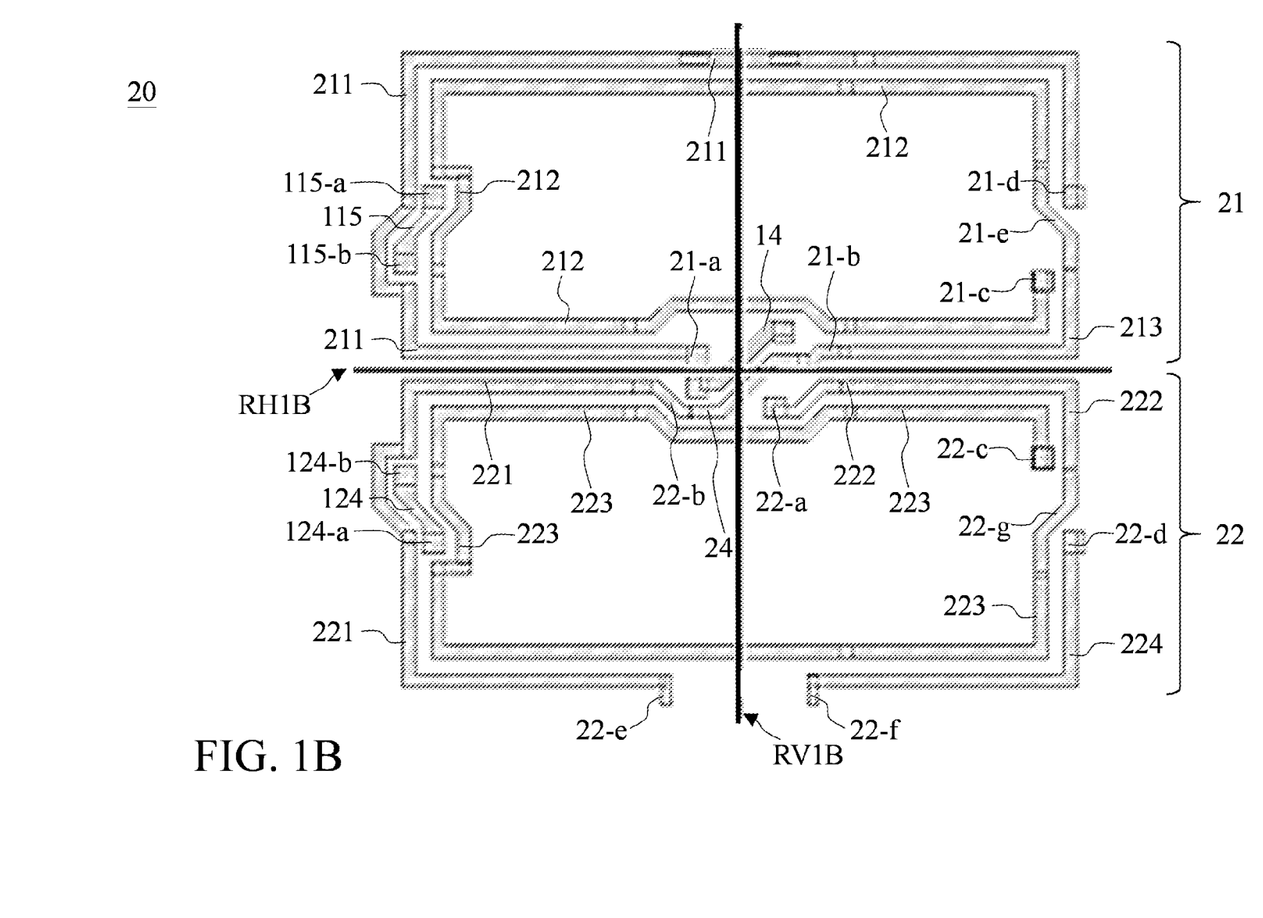
Figure 1C:
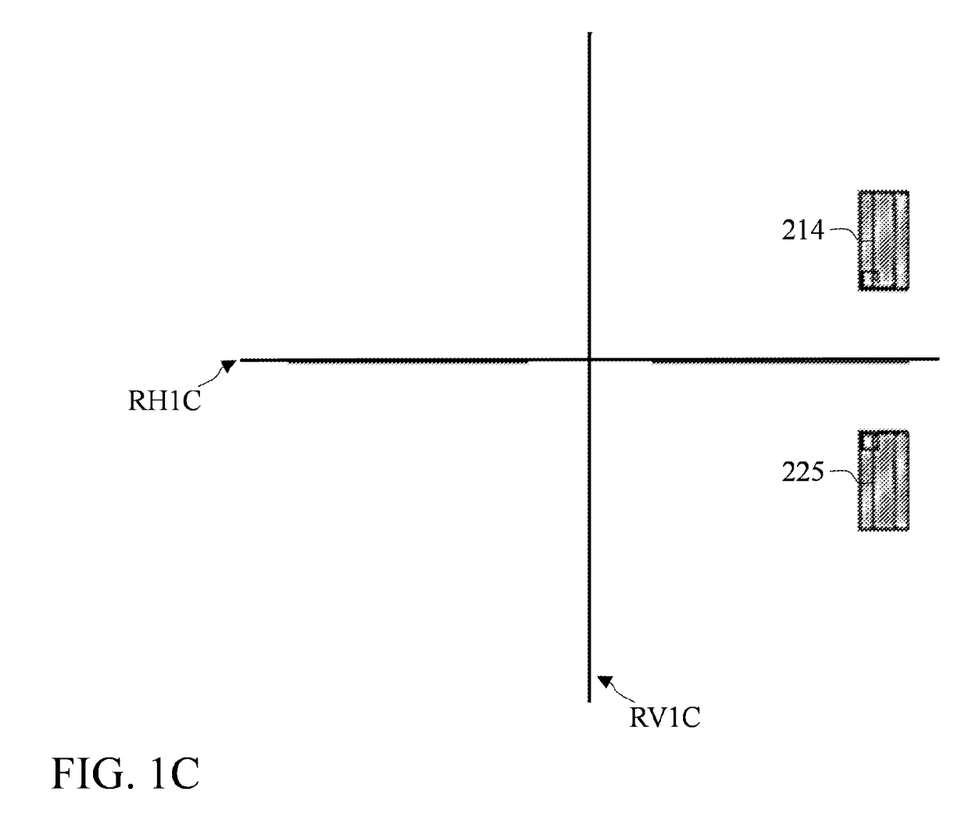

FIGS. 1A to 1C show the structure of an integrated transformer according to an embodiment of the present invention. The integrated transformer includes an inductor 10 (FIG. 1A) that is substantially implemented in the first metal layer, an inductor 20 (FIG. 1B) that is substantially implemented in the second metal layer, and some segments (FIG. 1C) that are implemented in the third metal layer. The first metal layer is different from the second metal layer. For example, these metal layers may include but not limited to the following layers: the first metal layer being a re-distribution layer (RDL) in the semiconductor structure, the second metal layer being an ultra-thick metal (UTM) layer in the semiconductor structure, and the third metal layer can be the sixth metal layer in the semiconductor structure.

As shown in FIG. 1A, the inductor 10 includes a winding 11 and a winding 12. The winding 11 and the winding 12 are formed by multiple traces, and one trace can be divided into multiple segments. The winding 11 includes four end points: the end point 11-a, the end point 11-b, the end point 11-e and the end point 11-f. The winding 12 includes two end points: the end point 12-a and the end point 12-b. The end point 11-e and the end point 11-f are the output/input terminals of the inductor 10 and also form one of the ports of the integrated transformer.

The winding 11 includes a segment 111, a segment 112, a segment 113 and a segment 114. Each segment has two end points, and the end points can be the end point or intermediate point of the trace. The end points of the segment 111 are the end point 11-e and the end point 11-g. The end points of the segment 112 are the end point 11-g and the end point 11-c. The end points of the segment 113 are the end point 11-d and the end point 11-a. The end points of the segment 114 are the end point 11-b and the end point 11-f. The winding 11 includes an outer turn and an inner turn—the outer turn includes the segment 111, the segment 113 and the segment 114, while the inner turn includes the segment 112. The segment 111 and the segment 112 belong to the same trace, and the end point 11-g is the intermediate point of the trace. For example, the end point 11-g can be located approximately at the junction of the outer turn and the inner turn.

The winding 12 includes a segment 121, a segment 122 and a segment 123. The end points of the segment 121 are the end point 12-a and the end point 12-e. The end points of the segment 122 are the end point 12-e and the end point 12-c. The end points of the segment 123 are the end point 12-b and the end point 12-d. The winding 12 includes an outer turn and an inner turn—the outer turn includes the segment 121 and the segment 123, while the inner turn includes the segment 122. The segment 121 and the segment 122 belong to the same trace, and the end point 12-e is the intermediate point of the trace. For example, the end point 12-e can be located approximately at the junction of the outer turn and the inner turn.

As shown in FIG. 1B, the inductor 20 includes a winding 21 and a winding 22. The winding 21 and the winding 22 are formed by multiple traces, and one trace can be divided into multiple segments. The winding 21 includes two end points: the end point 21-a and the end point 21-b. The winding 22 includes four end points: the end point 22-a, the end point 22-b, the end point 22-e and the end point 22-f. The end point 22-e and the end point 22-f are the output/input terminals of the inductor 20 and also form one of the ports of the integrated transformer.

The winding 21 includes a segment 211, a segment 212 and a segment 213. The end points of the segment 211 are the end point 21-a and the end point 21-d. The end points of the segment 212 are the end point 21-c and the end point 21-e. The end points of the segment 213 are the end point 21-e and the end point 21-b. The winding 21 includes an outer turn and an inner turn—the outer turn includes the segment 211 and the segment 213, while the inner turn includes the segment 212. The segment 212 and the segment 213 belong to the same trace, and the end point 21-e is the intermediate point of the trace. For example, the end point 21-e can be located approximately at the junction of the outer turn and the inner turn.

The winding 22 includes a segment 221, a segment 222, a segment 223 and a segment 224. The end points of the segment 221 are the end point 22-b and the end point 22-e. The end points of the segment 222 are the end point 22-a and the end point 22-g. The end points of the segment 223 are the end point 22-g and the end point 22-c. The end points of the segment 224 are the end point 22-d and the end point 22-f. The winding 22 includes an outer turn and an inner turn—the outer turn includes the segment 221, the segment 222 and the segment 224, while the inner turn includes the segment 223. The segment 222 and the segment 223 belong to the same trace, and the end point 22-g is the intermediate point of the trace. For example, the end point 22-g can be located approximately at the junction of the outer turn and the inner turn.

The reference line RH1A, the reference line RV1A, the reference line RH1B, the reference line RV1B, the reference line RH1C and the reference line RV1C in FIGS. 1A to 1C are not part of the integrated transformer or the integrated inductor; they are used for ease of discussion only. The reference line RH1A, the reference line RH1B and the reference line RH1C overlap, and the reference line RV1A, the reference line RV1B and the reference line RV1C overlap. In other words, the centers of FIGS. 1A to 1C overlap; that is, the inductor 10 and the inductor 20 substantially overlap.

The end point 11-c in FIG. 1A is connected to the end point 115-a in FIG. 1B through a through structure such as a via or a via array, and the end point 11-d in FIG. 1A is connected to the end point 115-b in FIG. 1B through a through structure. In other words, the segment 115 connects the end point 11-c and the end point 11-d; thus, the segment 115 can be considered part of the winding 11. Similarly, the end point 12-c in FIG. 1A is connected to the end point 124-a in FIG. 1B through a through structure, and the end point 12-d in FIG. 1A is connected to the end point 124-b in FIG. 1B through a through structure. In other words, the segment 124 connects the end point 12-c and the end point 12-d; thus, the segment 124 can be considered part of the winding 12. Similarly, the end point 11-b and the end point 12-b in FIG. 1A are connected to the segment 14 in FIG. 1B through the through structures. In other words, the segment 14 connects the end point 11-b and the end point 12-b; thus, the segment 14 can be considered part of the inductor 10. Since most of the segments constituting the inductor 10 are in the same metal layer, the inductor 10 is substantially implemented in the same metal layer. The end point 21-c and the end point 21-d in FIG. 1B are connected to the segment 214 in FIG. 1C through the through structures. In other words, the segment 214 connects the end point 21-c and the end point 21-d; thus, the 214 can be considered part of the winding 21. Similarly, the end point 22-c and the end point 22-d in FIG. 1B are connected to the segment 225 in FIG. 1C through the through structures. In other words, the segment 225 connects the end point 22-c and the end point 22-d; thus, the segment 225 can be considered part of the winding 22. Similarly, the end point 21-a and the end point 22-a in FIG. 1B are connected to the segment 23 in FIG. 1A through the through structures. In other words, the segment 23 connects the end point 21-a and the end point 22-a; thus, the segment 23 can be considered part of the inductor 20.

Since most of the segments constituting the inductor 20 are in the same metal layer, the inductor 20 is substantially implemented in the same metal layer.

The inductor 10 and the inductor 20 substantially overlap. In other words, the winding 11 substantially overlaps the winding 21, and the winding 12 substantially overlaps the winding 22. More specifically, since most segments of the outer turn of the winding 11 overlaps most segments of the outer turn of the winding 21, the outer turn of the winding 11 substantially overlaps the outer turn of the winding 21. Similarly, the inner turn of the winding 11 substantially overlaps the inner turn of the winding 21, the outer turn of the winding 12 substantially overlaps the outer turn of the winding 22, and the inner turn of the winding 12 substantially overlaps the inner turn of the winding 22.

The segment 113 in FIG. 1A and the segment 211 in FIG. 1B overlap in a region close to the reference line RH1A/RH1B, and the segment 121 in FIG. 1A and the segment 222 in FIG. 1B overlap in a region close to the reference line RH1A/RH1B. In the central region of the figure (i.e., near the intersection of the reference line RH1A and the reference line RV1A), the end point 11-a of the segment 113 (i.e., one of the end points of the winding 11) is connected to the end point 12-a of the segment 121 (i.e., one of the end points of the winding 12) through the segment 13, and the end point 21-a of the segment 211 (i.e., one of the end points of the winding 21) is connected to the end point 22-a of the segment 222 (i.e., one of the end points of the winding 22) through the segment 23. The segment 113, the segment 13 and the segment 121 belong to the same trace; the segment 13 is one of the segments of the trace, and the end point 11-a and the end point 12-a are the two end points of the segment 13. As shown in FIG. 1A, the segment 13 and the segment 23 are substantially parallel to each other.

Similarly, the segment 114 in FIG. 1A and the segment 213 in FIG. 1B overlap in a region close to the reference line RH1A/RH1B, and the segment 123 in FIG. 1A and the segment 221 in FIG. 1B overlap in a region close to the reference line RH1A/RH1B. In the central region of the figure, the end point 11-b of the segment 114 (i.e., one of the end points of the winding 11) is connected to the end point 12-b of the segment 123 (i.e., one of the end points of the winding 12) through the segment 14, and the end point 21-b of the segment 213 (i.e., one of the end points of the winding 21) is connected to the end point 22-b of the segment 221 (i.e., one of the end points of the winding 22) through the segment 24. The segment 213, the segment 24 and the segment 221 belong to the same trace; the segment 24 is one of the segments of the trace, and the end point 21-b and the end point 22-b are the two end points of the segment 24. As shown in FIG. 1B, the segment 14 and the segment 24 are substantially parallel to each other.

The design discussed above has the following advantages: (1) the two inductors of the integrated transformer have good symmetry by themselves—the inductor 10 is symmetric with respect to the reference line RH1A or the reference line RV1A, and the inductor 20 is symmetric with respect to the reference line RH1B or the reference line RV1B; (2) the inductor 10 and the inductor 20 substantially overlap, and so the coupling efficiency of the integrated transformer is good; (3) despite of the fact that the central regions of the two inductors substantially overlap, only two metal layers are used—more specifically, the two crossing structures of the integrated transformer, which include the crossing structure of the inductor 10 formed by the segment 13 and the segment 14 and the crossing structure of the inductor 20 formed by the segment 23 and the segment 24, use only two metal layers.

Figure 2A:
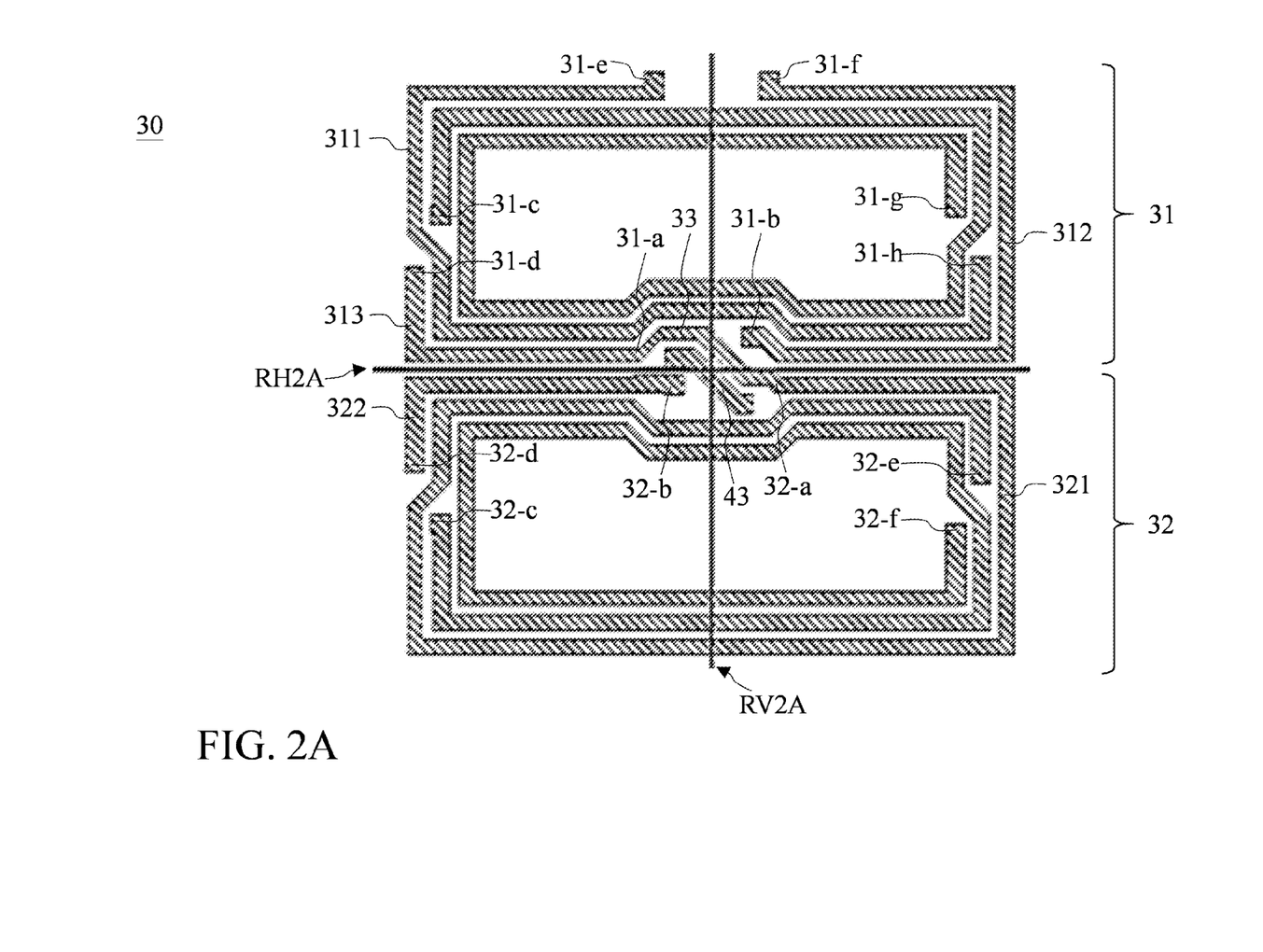
FIGS. 2A to 2C illustrate the structure of an integrated transformer according to another embodiment of the present invention.
Figure 2B:
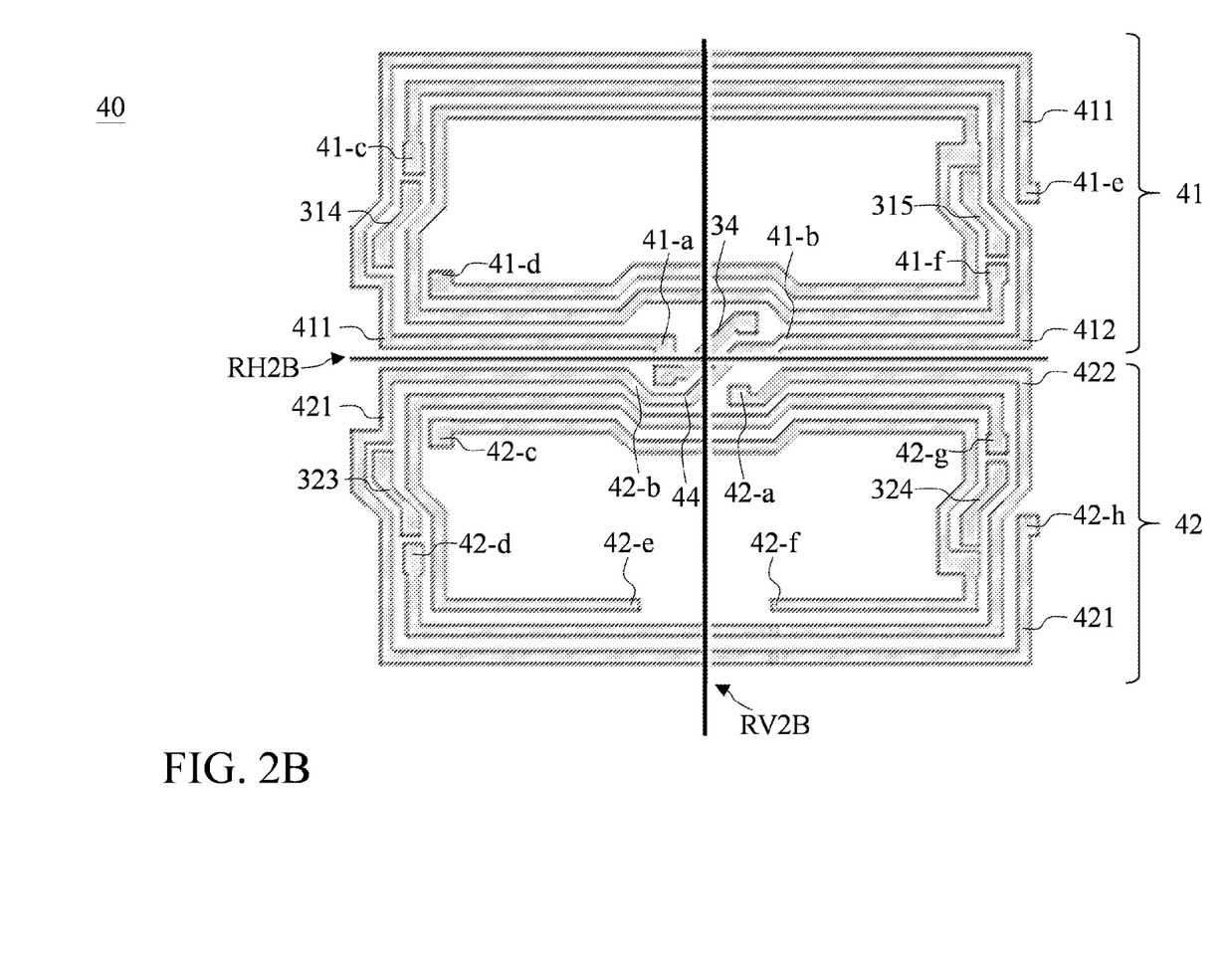
Figure 2C:
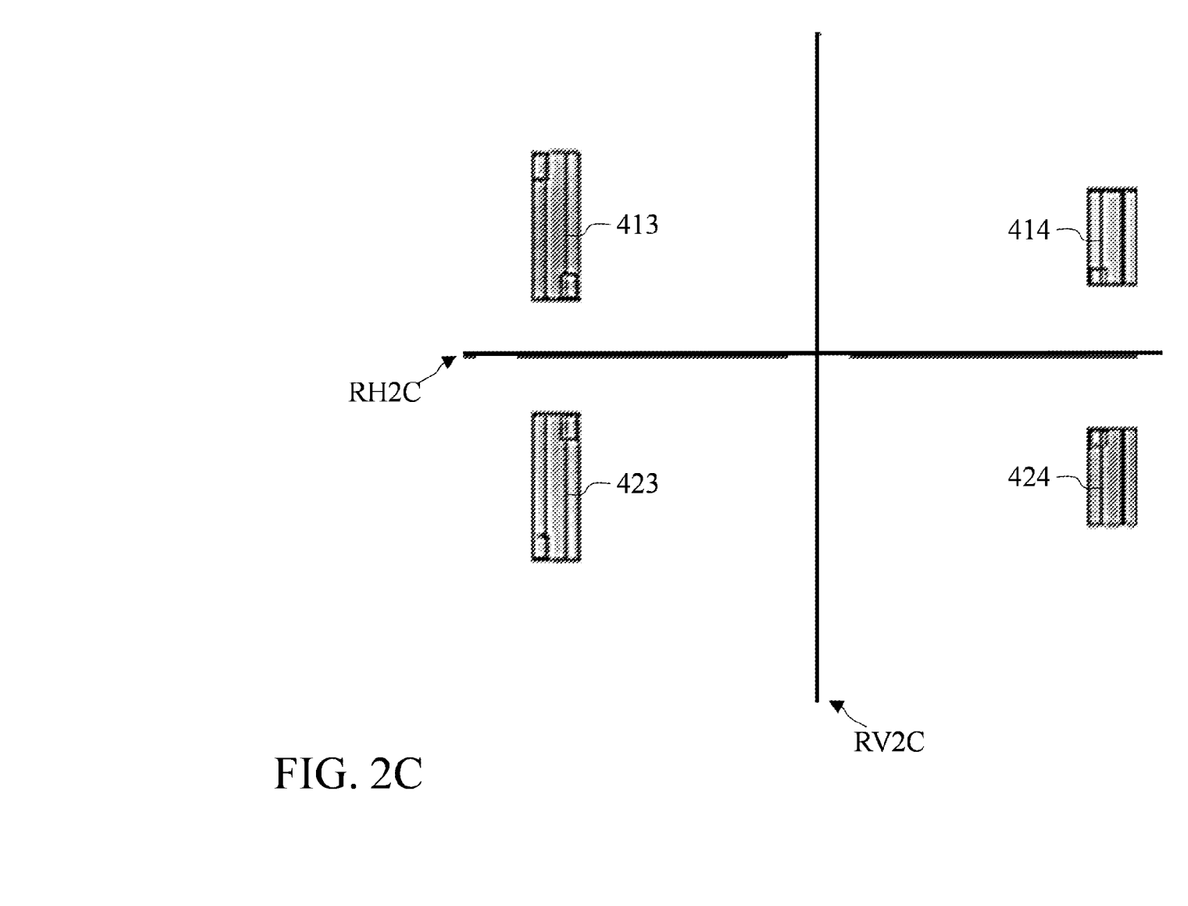

FIGS. 2A to 2C show the structure of an integrated transformer according to another embodiment of the present invention. The integrated transformer includes an inductor 30 (FIG. 2A) that is substantially implemented in the first metal layer, an inductor 40 (FIG. 2B) that is substantially implemented in the second metal layer, and some segments (FIG. 2C) that are implemented in the third metal layer. The first metal layer is different from the second metal layer.

As shown in FIG. 2A, the inductor 30 includes a winding 31 and a winding 32. The winding 31 and the winding 32 are formed by multiple traces, and one trace can be divided into multiple segments. The winding 31 includes four end points: the end point 31-a, the end point 31-b, the end point 31-e and the end point 31-f. The winding 32 includes two end points: the end point 32-a and the end point 32-b. The end point 31-e and the end point 31-f are the output/input terminals of the inductor 30 and also form one of the ports of the integrated transformer.

The winding 31 includes a segment 311, a segment 312 and a segment 313. The winding 31 includes an outer turn and an inner turn—the outer turn includes the segment 311, the segment 312 and the segment 313, while the inner turn includes the remaining segments of the winding 31.

The winding 32 includes a segment 321 and a segment 322. The winding 32 includes an outer turn and an inner turn—the outer turn includes the segment 321 and the segment 322, while the inner turn includes the remaining segments of the winding 32.

As shown in FIG. 2B, the inductor 40 includes a winding 41 and a winding 42. The winding 41 and the winding 42 are formed by multiple traces, and one trace can be divided into multiple segments. The winding 41 includes two end points: the end point 41-a and the end point 41-b. The winding 42 includes four end points: the end point 42-a, the end point 42-b, the end point 42-e and the end point 42-f. The end point 42-e and the end point 42-f are the output/input terminals of the inductor 40 and also form one of the ports of the integrated transformer.

The winding 41 includes a segment 411 and a segment 412. The winding 41 includes an outer turn and an inner turn—the outer turn includes the segment 411 and the segment 412, while the inner turn includes the remaining segments of the winding 41.

The winding 42 includes a segment 421 and a segment 422. The winding 42 includes an outer turn and an inner turn—the outer turn includes the segment 421 and the segment 422, while the inner turn includes the remaining segments of the winding 42.

The reference line RH2A, the reference line RV2A, the reference line RH2B, the reference line RV2B, the reference line RH2C and the reference line RV2C in FIGS. 2A to 2C are not part of the integrated transformer or the integrated inductor; they are used for ease of discussion only. The reference line RH2A, the reference line RH2B and the reference line RH2C overlap, and the reference line RV2A, the reference line RV2B and the reference line RV2C overlap. In other words, the centers of FIGS. 2A to 2C overlap; that is, the inductor 30 and the inductor 40 substantially overlap.

The end point 31-c and the end point 31-d in FIG. 2A are connected by the segment 314 in FIG. 2B, and so the segment 314 may be considered part of the winding 31. Similarly, the end point 31-g and the end point 31-h in FIG. 2A are connected by the segment 315 in FIG. 2B, and so the segment 315 may be considered part of the winding 31. Similarly, the end point 32-c and the end point 32-d in FIG. 2A are connected by the segment 323 in FIG. 2B, and so the segment 323 may be considered part of the winding 32. Similarly, the end point 32-e and the end point 32-f in FIG. 2A are connected by the segment 324 in FIG. 2B, and so the segment 324 may be considered part of the winding 32. Similarly, the end point 31-b and the end point 32-b in FIG. 2A are connected by the segment 34 in FIG. 2B, and so the segment 34 may be considered part of the winding 30. Since most of the segments constituting the inductor 30 are in the same metal layer, the inductor 30 is substantially implemented in the same metal layer.

The end point 41-c and the end point 41-d in FIG. 2B are connected by the segment 413 in FIG. 2C, and so the segment 413 may be considered part of the winding 41. Similarly, the end point 41-e and the end point 41-f in FIG. 2B are connected by the segment 414 in FIG. 2C, and so the segment 414 may be considered part of the winding 41. Similarly, the end point 42-c and the end point 42-d in FIG. 2B are connected by the segment 423 in FIG. 2C, and so the segment 423 may be considered part of the winding 42. Similarly, the end point 42-g and the end point 42-h in FIG. 2B are connected by the segment 424 in FIG. 2C, and so the segment 424 may be considered part of the winding 42. Similarly, the end point 41-a and the end point 42-a in FIG. 2B are connected by the segment 43 in FIG. 2A, and so the segment 43 may be considered part of the winding 40. Since most of the segments constituting the inductor 40 are in the same metal layer, the inductor 40 is substantially implemented in the same metal layer.

The inductor 30 and the inductor 40 substantially overlap. In other words, the winding 31 substantially overlaps the winding 41, and the winding 32 substantially overlaps the winding 42. More specifically, since most segments of the outer turn of the winding 31 overlaps most segments of the outer turn of the winding 41, the outer turn of the winding 31 substantially overlaps the outer turn of the winding 41. Similarly, the inner turn of the winding 31 substantially overlaps the inner turn of the winding 41, the outer turn of the winding 32 substantially overlaps the outer turn of the winding 42, and the inner turn of the winding 32 substantially overlaps the inner turn of the winding 42.

The segment 313 in FIG. 2A and the segment 411 in FIG. 2B overlap in a region close to the reference line RH2A/RH2B, and the segment 321 in FIG. 2A and the segment 422 in FIG. 2B overlap in a region close to the reference line RH2A/RH2B. In the central region of the figure (i.e., near the intersection of the reference line RH2A and the reference line RV2A), the end point 31-a of the segment 313 (i.e., one of the end points of the winding 31) is connected to the end point 32-a of the segment 321 (i.e., one of the end points of the winding 32) through the segment 33, and the end point 41-a of the segment 411 (i.e., one of the end points of the winding 41) is connected to the end 42-a of the segment 422 (i.e., one of the end points of the winding 42) through the segment 43. The segment 313, the segment 33 and the segment 321 belong to the same trace; the segment 33 is one of the segments of the trace, and the end point 31-a and the end point 32-a are the two end points of the segment 33. As shown in FIG. 2A, the segment 33 and the segment 43 are substantially parallel to each other.

Similarly, the segment 312 in FIG. 2A and the segment 412 in FIG. 2B overlap in a region close to the reference line RH2A/RH2B, and the segment 322 in FIG. 2A and the segment 421 in FIG. 2B overlap in a region close to the reference line RH2A/RH2B. In the central region of the figure, the end point 31-b of the segment 312 (i.e., one of the end points of the winding 31) is connected to the end point 32-b of the segment 322 (i.e., one of the end points of the winding 32) through the segment 34, and the end point 41-b of the segment 412 (i.e., one of the end points of the winding 41) is connected to the end point 42-b of the segment 421 (i.e., one of the end points of the winding 42) through the segment 44. The segment 412, the segment 44 and the segment 421 belong to the same trace; the segment 44 is one of the segments of the trace, and the end point 41-b and the end point 42-b are the two end points of the segment 44. As shown in FIG. 2B, the segment 34 and the segment 44 are substantially parallel to each other.

The integrated transformer in FIG. 2 (including FIGS. 2A to 2C) is similar to the integrated transformer in FIG. 1 (including FIGS. 1A to 1C) and has the same advantages. Since people having ordinary skill in the art can appreciate other details of the integrated transformer in FIG. 2 from the description of FIG. 1, these details are thus omitted for brevity. The windings in FIG. 1 are structures of two turns, whereas the windings in FIG. 2 are structures of three turns. The two ports of the integrated transformer in FIG. 1 are located at the outer turn of the windings, whereas one port of the integrated transformer in FIG. 2 is located at the outer turn of the winding (i.e., the port formed by the end point 31-e and the end point 31-f) and the other port is located at the inner turn of the winding (i.e., the port formed by the end point 42-e and the end point 42-f).

Figure 3A:
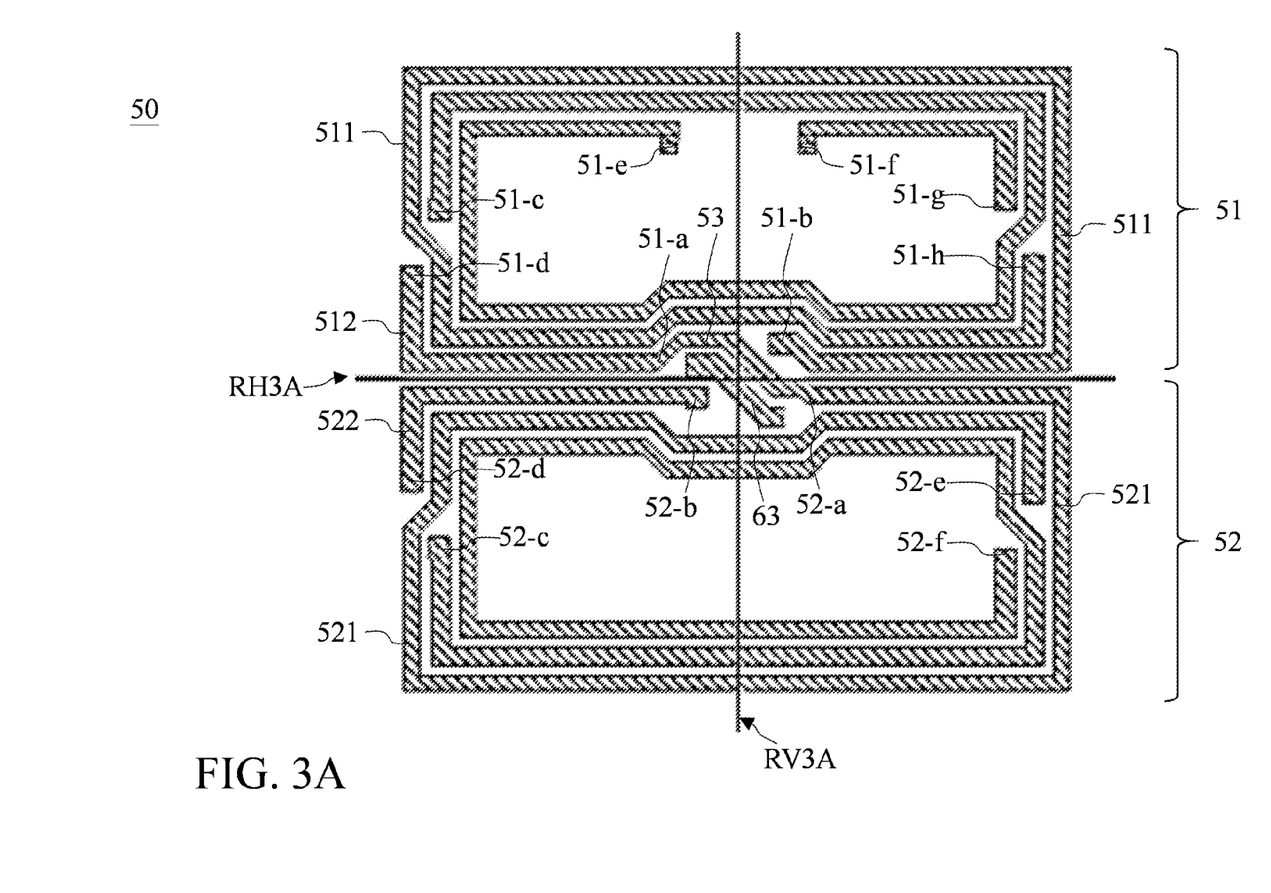
FIGS. 3A to 3C illustrate the structure of an integrated transformer according to another embodiment of the present invention.
Figure 3B:
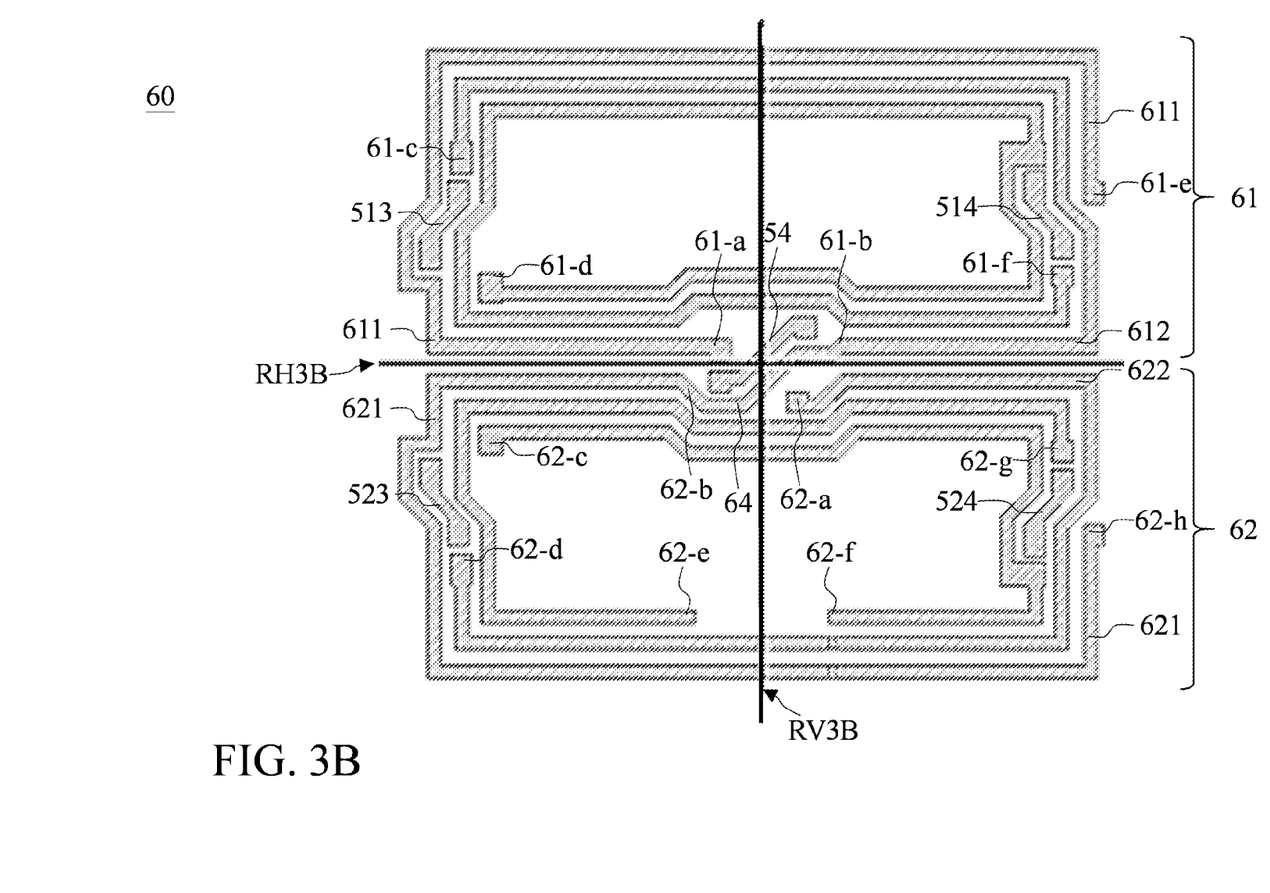
Figure 3C:
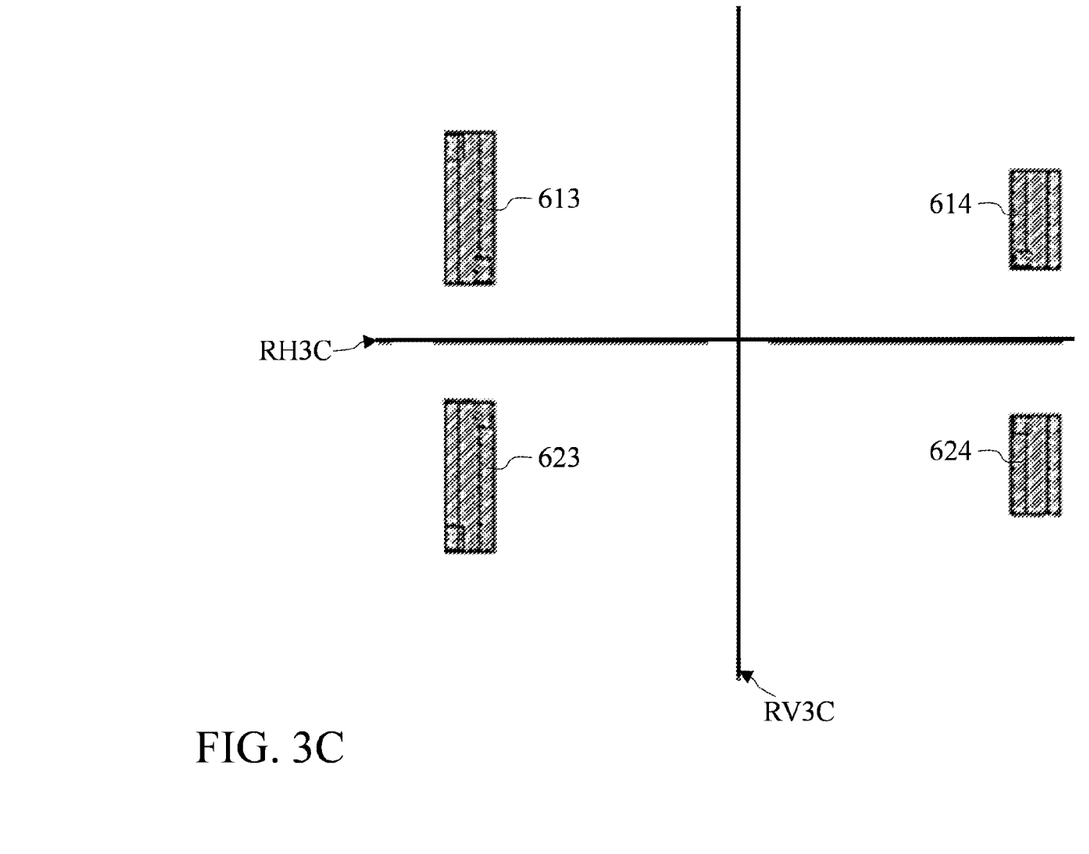

FIGS. 3A to 3C show the structure of an integrated transformer according to another embodiment of the present invention. The integrated transformer includes an inductor 50 (FIG. 3A) that is substantially implemented in the first metal layer, an inductor 60 (FIG. 3B) that is substantially implemented in the second metal layer, and some segments (FIG. 3C) that are implemented in the third metal layer. The first metal layer is different from the second metal layer.

As shown in FIG. 3A, the inductor 50 includes a winding 51 and a winding 52. The winding 51 and the winding 52 are formed by multiple traces, and one trace can be divided into multiple segments. The winding 51 includes four end points: the end point 51-a, the end point 51-b, the end point 51-e and the end point 51-f. The winding 52 includes two end points: the end point 52-a and the end point 52-b. The end point 51-e and the end point 51-f are the output/input terminals of the inductor 50 and also form one of the ports of the integrated transformer.

The winding 51 includes a segment 511 and a segment 512. The winding 51 includes an outer turn and an inner turn—the outer turn includes the segment 511 and the segment 512, while the inner turn includes the remaining segments of the winding 51.

The winding 52 includes a segment 521 and a segment 522. The winding 52 includes an outer turn and an inner turn—the outer turn includes the segment 521 and the segment 522, while the inner turn includes the remaining segments of the winding 52.

As shown in FIG. 3B, the inductor 60 includes a winding 61 and a winding 62. The winding 61 and the winding 62 are formed by multiple traces, and one trace can be divided into multiple segments. The winding 61 includes two end points: the end point 61-a and the end point 61-b. The winding 62 includes four end points: the end point 62-a, the end point 62-b, the end point 62-e and the end point 62-f. The end point 62-e and the end point 62-f are the output/input terminals of the inductor 60 and also form one of the ports of the integrated transformer.

The winding 61 includes a segment 611 and a segment 612. The winding 61 includes an outer turn and an inner turn—the outer turn includes the segment 611 and the segment 612, while the inner turn includes the remaining segments of the winding 61.

The winding 62 includes a segment 621 and a segment 622. The winding 62 includes an outer turn and an inner turn—the outer turn includes the segment 621 and the segment 622, while the inner turn includes the remaining segments of the winding 62.

The reference line RH3A, the reference line RV3A, the reference line RH3B, the reference line RV3B, the reference line RH3C and the reference line RV3C in FIGS. 3A to 3C are not part of the integrated transformer or the integrated inductor; they are used for ease of discussion only. The reference line RH3A, the reference line RH3B and the reference line RH3C overlap, and the reference line RV3A, the reference line RV3B and the reference line RV3C overlap. In other words, the centers of FIGS. 3A to 3C overlap; that is, the inductor 50 and the inductor 60 substantially overlap.

The end point 51-$c$ and the end point 51-$d$ in FIG. 3A are connected by the segment 513 in FIG. 3B, and so the segment 513 may be considered part of the winding 51. Similarly, the end point 51-$g$ and the end point 51-$h$ in FIG. 3A are connected by the segment 514 in FIG. 3B, and so the segment 514 may be considered part of the winding 51. Similarly, the end point 52-$c$ and the end point 52-$d$ in FIG. 3A are connected by the segment 523 in FIG. 3B, and so the segment 523 may be considered part of the winding 52. Similarly, the end point 52-$e$ and the end point 52-$f$ in FIG. 3A are connected by the segment 524 in FIG. 3B, and so the segment 524 may be considered part of the winding 52. Similarly, the end point 51-$b$ and the end point 52-$b$ in FIG. 3A are connected by the segment 54 in FIG. 3B, and so the segment 54 may be considered part of the inductor 50. Since most of the segments constituting the inductor 50 are in the same metal layer, the inductor 50 is substantially implemented in the same metal layer.

The end point 61-$c$ and the end point 61-$d$ in FIG. 3B are connected by the segment 613 in FIG. 3C, and so the segment 613 may be considered part of the winding 61. Similarly, the end point 61-$e$ and the end point 61-$f$ in FIG. 3B are connected by the segment 614 in FIG. 3C, and so the segment 614 may be considered part of the winding 61. Similarly, the end point 62-$c$ and the end point 62-$d$ in FIG. 3B are connected by the segment 623 in FIG. 3C, and so the segment 623 may be considered part of the winding 62. Similarly, the end point 62-$g$ and the end point 62-$h$ in FIG. 3B are connected by the segment 624 in FIG. 3C, and so the segment 624 may be considered part of the winding 62. Similarly, the end point 61-$a$ and the end point 62-$a$ in FIG. 3B are connected by the segment 63 in FIG. 3A, and so the segment 63 may be considered part of the inductor 60. Since most of the segments constituting the inductor 60 are in the same metal layer, the inductor 60 is substantially implemented in the same metal layer.

The inductor 50 and the inductor 60 substantially overlap. In other words, the winding 51 substantially overlaps the winding 61, and the winding 52 substantially overlaps the winding 62. More specifically, since most segments of the outer turn of the winding 51 overlaps most segments of the outer turn of the winding 61, the outer turn of the winding 51 substantially overlaps the outer turn of the winding 61. Similarly, the inner turn of the winding 51 substantially overlaps the inner turn of the winding 61, the outer turn of the winding 52 substantially overlaps the outer turn of the winding 62, and the inner turn of the winding 52 substantially overlaps the inner turn of the winding 62.

The segment 512 in FIG. 3A and the segment 611 in FIG. 3B overlap in a region close to the reference line RH3A/RH3B, and the segment 521 in FIG. 3A and the segment 622 in FIG. 3B overlap in a region close to the reference line RH3A/RH3B. In the central region of the figure (i.e., near the intersection of the reference line RH3A and the reference line RV3A), the end point 51-$a$ of the segment 512 (i.e., one of the end points of the winding 51) is connected to the end point 52-$a$ of the segment 521 (i.e., one of the end points of the winding 52) through the segment 53, and the end point 61-$a$ of the segment 611 (i.e., one of the end points of the winding 61) is connected to the end point 62-$a$ of the segment 622 (i.e., one of the end points of the winding 62) through the segment 63. The segment 512, the segment 53 and the segment 521 belong to the same trace; the segment 53 is one of the segments of the trace, and the end point 51-$a$ and the end point 52-$a$ are the two end points of the segment 53. As shown in FIG. 3A, the segment 53 and the segment 63 are substantially parallel to each other.

Similarly, the segment 511 in FIG. 3A and the segment 612 in FIG. 3B overlap in a region close to the reference line RH3A/RH3B, and the segment 522 in FIG. 3A and the segment 621 in FIG. 3B overlap in a region close to the reference line RH3A/RH3B. In the central region of the figure, the end point 51-$b$ of the segment 511 (i.e., one of the end points of the winding 51) is connected to the end point 52-$b$ of the segment 522 (i.e., one of the end points of the winding 52) through the segment 54, and the end point 61-$b$ of the segment 612 (i.e., one of the end points of the winding 61) is connected to the end point 62-$b$ of the segment 621 (i.e., one of the end points of the winding 62) through the segment 64. The segment 612, the segment 64 and the segment 621 belong to the same trace; the segment 64 is one of the segments of the trace, and the end point 61-$b$ and the end point 62-$b$ are the two end points of the segment 64. As shown in FIG. 3B, the segment 54 and the segment 64 are substantially parallel to each other.

The integrated transformer in FIG. 3 (including FIGS. 3A to 3C) is similar to the integrated transformer in FIG. 1 and has the same advantages. Since people having ordinary skill in the art can appreciate other details of the integrated transformer in FIG. 3 from the description of FIG. 1, these details are thus omitted for brevity. The windings in FIG. 1 are structures of two turns, while the windings in FIG. 3 are structure of three turns. The two ports of the integrated transformer in FIG. 1 are at the outer turn of the windings, whereas the two ports of the integrated transformer in FIG. 3 are at the inner turn of the windings.

Figure 4A:
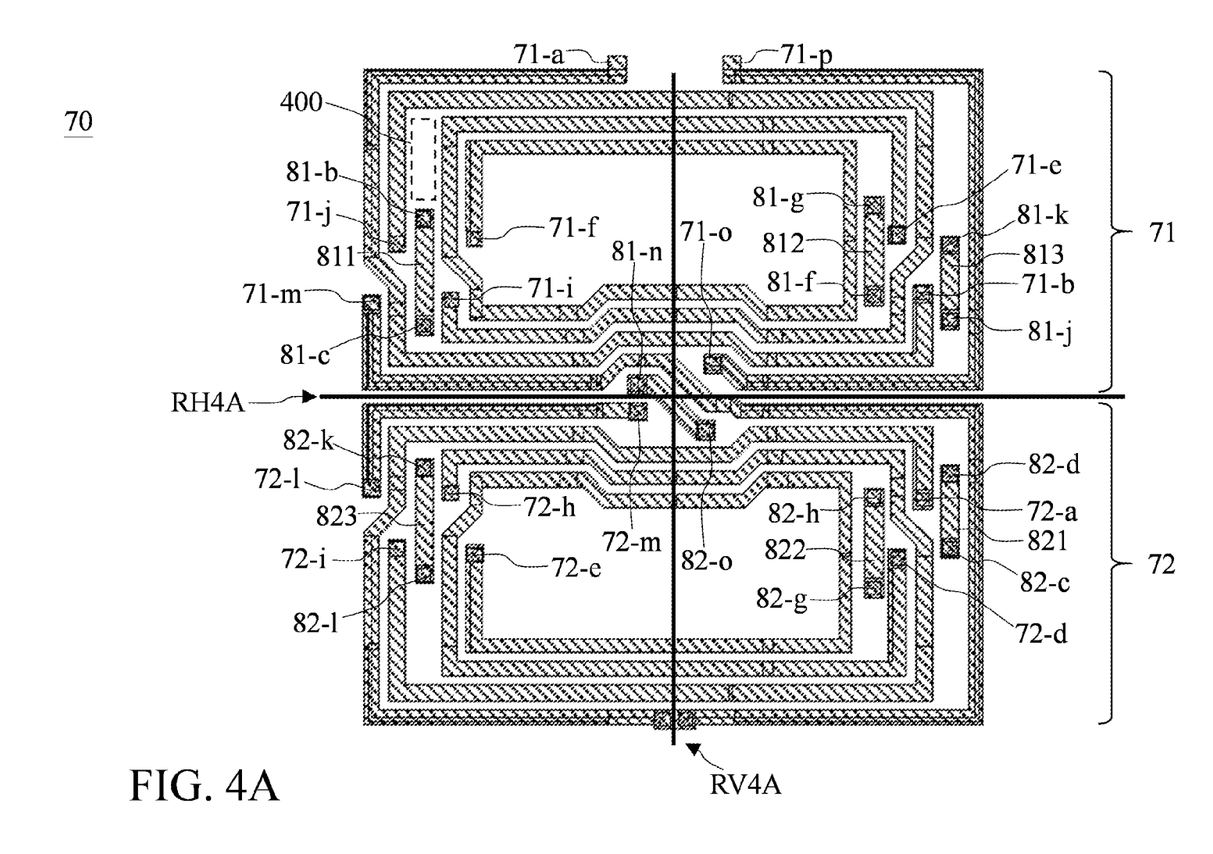
FIGS. 4A to 4B illustrate the structure of an integrated transformer according to another embodiment of the present invention.
Figure 4B:
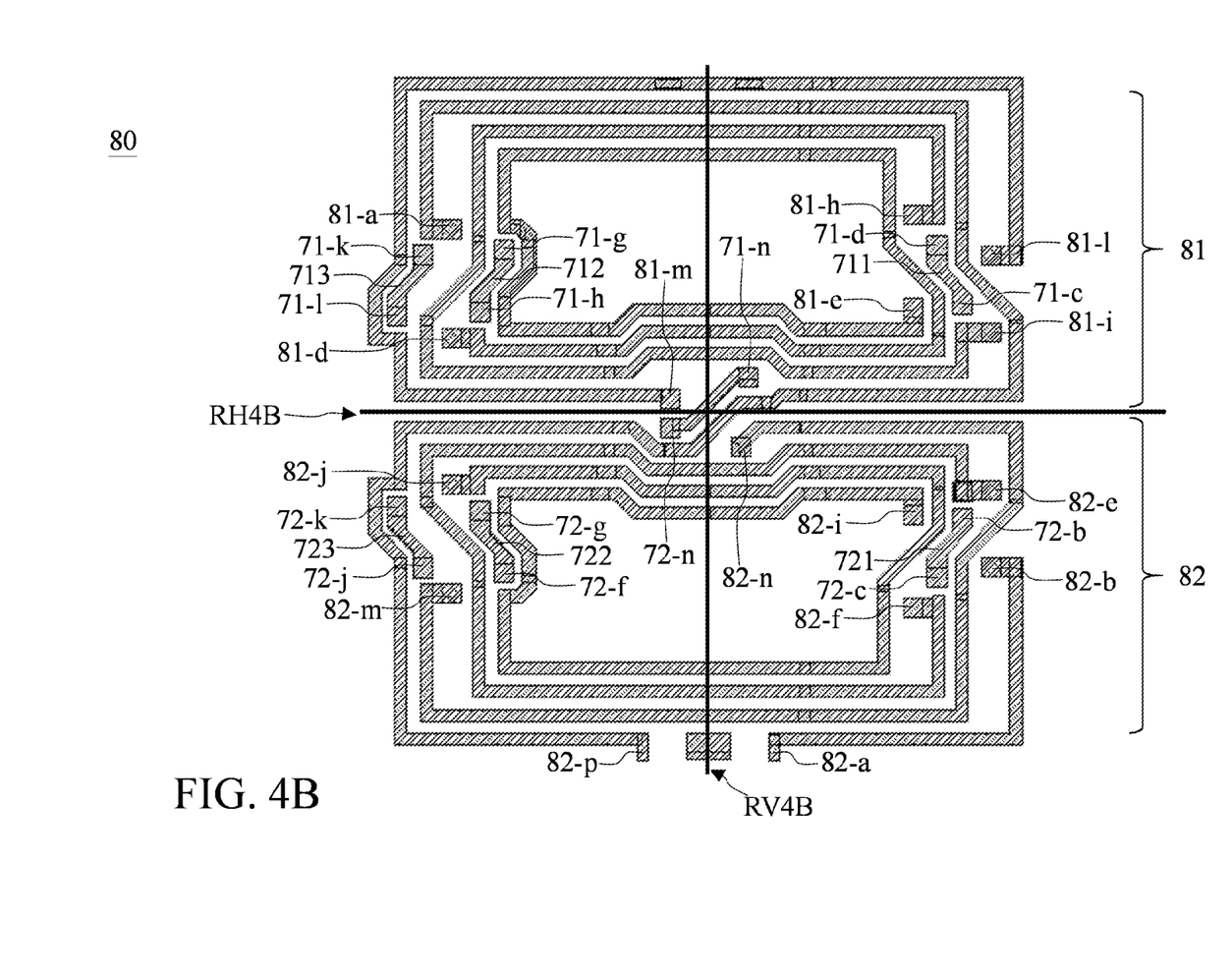

FIGS. 4A to 4B show the structure of an integrated transformer according to another embodiment of the present invention. The integrated transformer includes an inductor 70 (FIG. 4A) that is substantially implemented in the first metal layer and an inductor 80 (FIG. 4B) that is substantially implemented in the second metal layer. The first metal layer is different from the second metal layer. The inductor 70 includes a winding 71 and a winding 72. The end point 71-$a$ and the end point 71-$p$ are the output/input terminals of the inductor 70 and also form one of the ports of the integrated transformer. Similarly, the inductor 80 includes the winding 81 and the winding 82. The end point 82-$a$ and the end point 82-$p$ are the output/input terminals of the inductor 80 and also form one of the ports of the integrated transformer.

The reference line RH4A, the reference line RV4A, the reference line RH4B and the reference line RV4B in FIGS. 4A to 4B are not part of the integrated transformer or the integrated inductor; they are used for ease of discussion only. The reference line RH4A overlaps with the reference line RH4B, and the reference line RV4A overlaps with the reference line RV4B. In other words, the centers of FIGS. 4A to 4B overlap; that is, the inductor 70 and the inductor 80 substantially overlap.

The end point 71-*b* in FIG. 4A is connected to the end point 71-*c* in FIG. 4B through a through structure. The end point 71-*d* in FIG. 4B is connected to the end point 71-*e* in FIG. 4A through a through structure. The end point 71-*f* in FIG. 4A is connected to the end point 71-*g* in FIG. 4B through a through structure. The end point 71-*h* in FIG. 4B is connected to the end point 71-*i* in FIG. 4A through a through structure. The end point 71-*j* in FIG. 4A is connected to the end point 71-*k* in FIG. 4B through a through structure. The end point 71-*l* in FIG. 4B is connected to the end point 71-*m* in FIG. 4A through a through structure. The end point 71-*n* in FIG. 4B is connected to the end point 71-*o* in FIG. 4A through a through structure.

The end point 72-*a* in FIG. 4A is connected to the end point 72-*b* in FIG. 4B through a through structure. The end point 72-*c* in FIG. 4B is connected to the end point 72-*d* in FIG. 4A through a through structure. The end point 72-*e* in FIG. 4A is connected to the end point 72-*f* in FIG. 4B through a through structure. The end point 72-*g* in FIG. 4B is connected to the end point 72-*h* in FIG. 4A through a through structure. The end point 72-*i* in FIG. 4A is connected to the end point 72-*j* in FIG. 4B through a through structure. The end point 72-*k* in FIG. 4B is connected to the end point 72-*l* in FIG. 4A through a through structure. The end point 72-*m* in FIG. 4A is connected to the end point 72-*n* in FIG. 4B through a through structure.

The end point 82-*b* in FIG. 4B is connected to the end point 82-*c* in FIG. 4A through a through structure. The end point 82-*d* in FIG. 4A is connected to the end point 82-*e* in FIG. 4B through a through structure. The end point 82-*f* in FIG. 4B is connected to the end point 82-*g* in FIG. 4A through a through structure. The end point 82-*h* in FIG. 4A is connected to the end point 82-*i* in FIG. 4B through a through structure. The end point 82-*j* in FIG. 4B is connected to the end point 82-*k* in FIG. 4A through a through structure. The end point 82-*l* in FIG. 4A is connected to the end point 82-*m* in FIG. 4B through a through structure. The end point 82-*n* in FIG. 4B is connected to the end point 82-*o* in FIG. 4A through a through structure.

The end point 81-*a* in FIG. 4B is connected to the end point 81-*b* in FIG. 4A through a through structure. The end point 81-*c* in FIG. 4A is connected to the end point 81-*d* in FIG. 4B through a through structure. The end point 81-*e* in FIG. 4B is connected to the end point 81-*f* in FIG. 4A through a through structure. The end point 81-*g* in FIG. 4A is connected to the end point 81-*h* in FIG. 4B through a through structure. The end point 81-*i* in FIG. 4B is connected to the end point 81-*j* in FIG. 4A through a through structure. The end point 81-*k* in FIG. 4A is connected to the end point 81-*l* in FIG. 4B through a through structure. The end point 81-*m* in FIG. 4B is connected to the end point 81-*n* in FIG. 4A through a through structure.

The segment 811, the segment 812 and the segment 813 in FIG. 4A are part of the winding 81. The segment 821, the segment 822 and the segment 823 in FIG. 4A are part of the winding 82. The segment 811, the segment 812 and the segment 813 are arranged within the outer turn of the winding 71, that is, the segment 811, the segment 812 and the segment 813 are arranged within the area substantially surrounded by the outer turn of the winding 71. Similarly, the segment 821, the segment 822 and the segment 823 are arranged within the outer turn of the winding 72, that is, the segment 821, the segment 822 and the segment 823 are arranged within the area substantially surrounded by the outer turn of the winding 72.

Similarly, the segment 711, the segment 712 and the segment 713 in FIG. 4B are part of the winding 71. The segment 721, the segment 722 and the segment 723 in FIG. 4B are part of the winding 72. The segment 711, the segment 712 and the segment 713 are arranged within the outer turn of the winding 81, that is, the segment 711, the segment 712 and the segment 713 are arranged within the area substantially surrounded by the outer turn of the winding 81. Similarly, the segment 721, the segment 722 and the segment 723 are arranged within the outer turn of the winding 82, that is, the segment 721, the segment 722 and the segment 723 are arranged within the area substantially surrounded by the outer turn of the winding 82.

The inductor 70 and the inductor 80 substantially overlap. In other words, the winding 71 substantially overlaps the winding 81, and the winding 72 substantially overlaps the winding 82. More specifically, since most segments of the outer turn of the winding 71 overlaps most segments of the outer turn of the winding 81, the outer turn of the winding 71 substantially overlaps the outer turn of the winding 81. Similarly, the inner turn of the winding 71 substantially overlaps the inner turn of the winding 81, the outer turn of the winding 72 substantially overlaps the outer turn of the winding 82, and the inner turn of the winding 72 substantially overlaps the inner turn of the winding 82.

There are similarities and differences between the integrated transformer in FIG. 4 (including FIGS. 4A to 4B) and the integrated transformer in FIG. 1. One similarity is that the two ports of the integrated transformer are located at the outer turns of the windings. The differences include the followings: (1) each winding of the integrated transformer in FIG. 1 is a structure of two turns, and each winding of the integrated transformer in FIG. 4 is a structure of four turns; and (2) the integrated transformer in FIG. 1 is implemented in three metal layers, whereas the integrated transformer in FIG. 4 requires only two metal layers.

In some embodiments, traces or segments on either side of the empty space adjacent to the segment 811 (as indicated by the selection 400 in FIG. 4A) may be widened to fill the empty space. Similarly, empty spaces adjacent to the segment 812, the segment 813, the segment 821, the segment 822, the segment 823, the segment 711, the segment 712, the segment 713, the segment 721, the segment 722 and the segment 723 can be filled in a similar manner. Filling the empty spaces can increase the mutual inductance between the inductor 70 and the inductor 80, thereby improving the performance of the integrated transformer.

In the foregoing embodiments, the numbers of turns of the windings are intended to illustrate the invention by way of examples, rather than to limit the scope of the claimed invention. People having ordinary skill in the art can implement the windings in any number of turns in accordance with the embodiments discussed above.

Please note that the shape, size and ratio of any element in the disclosed figures are exemplary for understanding, not for limiting the scope of this invention. The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An integrated transformer comprising:
a first inductor substantially implemented in a first metal layer of a semiconductor structure and comprising a first winding and a second winding, wherein the first winding has a first outer turn and a first inner turn, and the second winding has a second outer turn and a second inner turn;
a second inductor substantially implemented in a second metal layer of the semiconductor structure and comprising a third winding and a fourth winding, wherein the third winding has a third outer turn and a third inner turn, and the fourth winding has a fourth outer turn and a fourth inner turn; and
wherein the first outer turn and the third outer turn substantially overlap, the second outer turn and the fourth outer turn substantially overlap, the first outer turn and the second outer turn are connected through a first segment and a second segment crossing each other, the third outer turn and the fourth outer turn are connected through a third segment and a fourth segment crossing each other, the first segment and the third segment are in the first metal layer, the second segment and the fourth segment are in the second metal layer, and the first metal layer is different from the second metal layer; and
wherein the first outer turn and the third outer turn substantially overlap in a direction perpendicular to the first metal layer or the second metal layer, and the second outer turn and the fourth outer turn substantially overlap in the direction perpendicular to the first metal layer or the second metal layer.

2. The integrated transformer of claim 1, wherein the first winding and the third winding substantially overlap, and the second winding and the fourth winding substantially overlap.

3. The integrated transformer of claim 1, wherein the first inductor and the second inductor substantially overlap.

4. The integrated transformer of claim 1, wherein a first output/input terminal and a second output/input terminal of the first inductor are located at the first outer turn, and a third output/input terminal and a fourth output/input terminal of the second inductor are located at the fourth outer turn.

5. The integrated transformer of claim 1, wherein a first output/input terminal and a second output/input terminal of the first inductor are located at the first outer turn, and a third output/input terminal and a fourth output/input terminal of the second inductor are located at the fourth inner turn.

6. The integrated transformer of claim 1, wherein a first output/input terminal and a second output/input terminal of the first inductor are located at the first inner turn, and a third output/input terminal and a fourth output/input terminal of the second inductor are located at the fourth inner turn.

7. The integrated transformer of claim 1, wherein at least one segment of the first inductor is implemented in the second metal layer, at least one segment of the second inductor is implemented in the first metal layer, and the integrated transformer uses only two metal layers.

8. The integrated transformer of claim 7, wherein the at least one segment of the first inductor is arranged within the third outer turn and the fourth outer turn, and the at least one segment of the second inductor is arranged within the first outer turn and the second outer turn.

* * * * *